(12) United States Patent
Goushcha et al.

(10) Patent No.: US 7,276,770 B1
(45) Date of Patent: Oct. 2, 2007

(54) FAST SI DIODES AND ARRAYS WITH HIGH QUANTUM EFFICIENCY BUILT ON DIELECTRICALLY ISOLATED WAFERS

(75) Inventors: Alexander O. Goushcha, Aliso Viejo, CA (US); Richard A. Metzler, Medina, OH (US)

(73) Assignee: Semicoa Semiconductors, Costa Mesa, CA (US)

( * ) Notice: Subject to any disclaimer, the term of this patent is extended or adjusted under 35 U.S.C. 154(b) by 350 days.

(21) Appl. No.: 11/102,264

(22) Filed: Apr. 7, 2005

Related U.S. Application Data

(60) Provisional application No. 60/560,881, filed on Apr. 9, 2004.

(51) Int. Cl.
H01L 27/14 (2006.01)
H01L 31/00 (2006.01)

(52) U.S. Cl. .................. 257/431; 257/290; 257/443; 257/459

(58) Field of Classification Search ................ 257/290, 257/431, 443, 459
See application file for complete search history.

(56) References Cited

U.S. PATENT DOCUMENTS

| | | | |
|---|---|---|---|
| 3,971,057 A | 7/1976 | Connors et al. | |
| 4,053,919 A | 10/1977 | Andrews, II et al. | |
| 4,131,793 A | 12/1978 | Stoutmeyer et al. | |
| 4,631,566 A | 12/1986 | Campbell et al. | |
| 4,746,620 A | 5/1988 | Diadiuk et al. | |
| 5,051,804 A | 9/1991 | Morse et al. | |
| 5,525,828 A | 6/1996 | Bassous et al. | |
| 6,303,967 B1 * | 10/2001 | Irissou | 257/406 |
| 6,323,480 B1 | 11/2001 | Tran et al. | |
| 6,613,600 B2 | 9/2003 | Tran et al. | |
| 6,667,528 B2 | 12/2003 | Cohen et al. | |
| 6,828,642 B2 | 12/2004 | Claiborne et al. | |
| 7,134,343 B2 * | 11/2006 | Suzuki et al. | 73/655 |
| 2005/0063835 A1 * | 3/2005 | Buettner et al. | 417/273 |
| 2007/0028695 A1 * | 2/2007 | Suzuki et al. | 73/655 |

OTHER PUBLICATIONS

Kato, Kazutoshi et al., "A High-Efficiency 50 GHz InGaAs Multimode Waveguide Photodetector", IEEE Journal of Quantum Electronics, Dec. 1992, pp. 2728-2735, vol. 28, No. 12.

Chen, Erli et al., "High-efficiency and high-speed silicon metal-semiconductor-metal photodetectors operating in the infrared", Appl. Phys. Lett., Feb. 10, 1997, pp. 753-755, vol. 70, No. 6.

Unterbörsch, G. et al., "High-Power Performance of a High-Speed Photodetector", Proc. of the ECOC in Madrid, Spain, Sep. 1998, pp. 67-68.

(Continued)

Primary Examiner—Fernando L. Toledo
(74) Attorney, Agent, or Firm—Blakely, Sokoloff, Taylor & Zafman LLP

(57) ABSTRACT

Fast silicon diodes and arrays with high quantum efficiency built on dielectrically isolated wafers. A waveguide is formed in the top surface of the silicon that utilizes total internal reflection from the Si—Si Oxide interface to form an internal mirror. This mirror reflects incoming light into the waveguide cavity, with the light being trapped there by surrounding reflective interfaces. A masking layer may be used to define an input window. Individual diodes or linear arrays may be formed as desired. Some alternate embodiments are described.

25 Claims, 12 Drawing Sheets

OTHER PUBLICATIONS

Takeuchi, T. et al., "High-speed, high-power and high-efficiency photodiodes with evanescently coupled graded-index waveguide", Electronics Letters, May 25, 2000, pp. 972-973, vol. 36, No. 11.

Emsley, Matthew K. et al., "Epitaxy-Ready Reflecting Substrates for Resonant-Cavity-Enhanced Silicon Photodetectors", Lasers and Electro-Optics Society 2000 Annual Meeting, Nov. 13-16, 2000, pp. 432-433, vol. 2.

Takeuchi, T. et al., "A high-power and high-efficiency photodiode with an evanescently coupled graded-index waveguide for 40 Gb/s applications", Proc. OFC 2001, pp. WQ2-1-QW2-3, vol. 3.

Xia, Fengnian et al., "An Asymmetric Twin-Waveguide High-Bandwidth Photodiode Using a Lateral Taper Coupler", IEEE Photonics Technology Letters, Aug. 2001, pp. 845-847, vol. 13, No. 8.

Emsley, Matthew K. et al, "High-Efficiency, 10 GHz Bandwidth Resonant-Cavity-Enhanced Silicon Photodetectors Operating at 850 nm Wavelength", Lasers and Electro-Optics Society 2001 Annual Meeting, Nov. 12-13, 2001, pp. 839-840, vol. 2.

Gökkavas, M. et al., "High-Speed High Efficiency Large-Area Resonant Cavity Enhanced p-i-n Photodiodes for Multimode Fiber Communications", IEEE Photonics Technology Letters, Dec. 2001, pp. 1349-1351, vol. 13, No. 12.

Zimmerman, H. et al., "Large-Area Lateral P-I-N Photodiode on SOI", IEEE Transactions on Electron Devices, Feb. 2002, pp. 334-336, vol. 49, No. 2.

Emsley, Matthew K. et al., "High-Speed Resonant-Cavity-Enhanced Silicon Photodetectors on Reflecting Silicon-On-Insulator Substrates", IEEE Photonics Technology Letters, Apr. 2002, pp. 519-521, vol. 14, No. 4.

CSUTAK, S. M. et al., "CMOS-Compatible Planar Silicon Waveguide-Grating-Coupler Photodetectors Fabricated on Silicon-on-Insulator (SOI) Substrates", IEEE Journal of Quantum Electronics, May 2002, pp. 477-480, vol. 38, No. 5.

Yang, Min et al., "A High-Speed, High-Sensitivity Silicon Lateral Trench Photodetector", IEEE Electron Device Letters, Jul. 2002, pp. 395-397, vol. 23, No. 7.

Emsley, Matthew K. et al., "Silicon Substrates With Buried Distributed Bragg Reflectors for Resonant Cavity-Enhanced Optoelectronics", IEEE Journal of Selected Topics in Quantum Electronics, Jul./Aug. 2002, pp. 948-955, vol. 8, No. 4.

DeMiguel, Stephane et al., "Evanescently Coupled Photodiodes Integrating a Double-Stage Taper for 40-Gb/s Applications—Compared Performance With Side-Illuminated Photodiodes", Journal of Lightwave Technology, Dec. 2002, pp. 2004-2014, vol. 20, No. 12.

Emsley, M.K. et al., "Realization of High-Efficiency 10 GHz Bandwidth Silicon Photodetector Arrays for Fully Integrated Optical Data Communication Interfaces", 2003.

Emsley, M. K. et al., "Silicon Resonant Cavity Enhanced Photodetector Arrays for Optical Interconnects", 2003.

DeMiguel, Stephane et al, "Very High-Responsivity Evanescently Coupled Photodiodes Integrating a Short Planar Multimode Waveguide for High-Speed Applications", IEEE Photonics Technology Letters, Dec. 2003, pp. 1761-1763, vol. 15, No. 12.

DeMiguel, S. et al., "High-Responsivity and high-speed evanescently-coupled avalanche photodiodes", Electronics Letters, Dec. 11, 2003, vol. 39, No. 25.

Dosunmu, O. I. et al., "Germanium on double-SOI photodetectors for 1550 nm operation", Proceedings of SPIE, Bellingham, WA, 2004, pp. 65-71, vol. 5353.

Schaub, Jeremy D. et al., "High speed, lateral PIN photodiodes in silicon technologies", Proceedings of SPIE, Bellingham, WA, 2004, pp. 1-11, vol. 5353.

Campbell, Joe C. et al., "High-speed waveguide photodetectors", OFC Conference, Feb. 23-24, 2004, vol. 95/A.

* cited by examiner

Fast, waveguide-type Si photodiode with a high responsivity at NIR

Active area size: 14 um x 50 um  
Waveguide width: 20 um  
Junction area: 50 um x 2000 um

| Type | Resistivity | Dopant concentration | Bias | Depletion width | Response time | Frequency bandwidth | Junction Capacitance | Sensitivity (internal) @ 1064 nm | Internal QE @ 1064 |
|---|---|---|---|---|---|---|---|---|---|
| | ohm-cm | cm$^{-3}$ | V | um | ns | MHz | pF | A/W | % |
| n on p photo-diode | 400 | 1.0E+13 | 10 | 20 | 0.4 | 2,500 | <1 | 0.80 | 95 |
| p on n photo-diode | 40 | 1.0E+14 | 40 | 23 | 0.5 | 2,000 | <1 | 0.80 | 95 |
| p on n photo-diode | 70 | 6.0E+13 | 20 | 21 | 0.6 | 1,650 | <1 | 0.80 | 95 |

Figure 9

Fast, waveguide-type Si photodiode with a high responsivity at NIR

Active area size: 21 um x 50 um    Junction area: 50 um x 2000 um
Waveguide width: 30 um

| Type | Resistivity | Dopant concentration | Bias | Depletion width | Response time | Frequency bandwidth | Junction Capacitance | Sensitivity (internal) @ 1064 nm | Internal QE @ 1064 |
|---|---|---|---|---|---|---|---|---|---|
| | ohm-cm | cm⁻³ | V | um | ns | MHz | pF | A/W | % |
| n on p photo-diode | 400 | 1.0E+13 | 40 | 39 | 0.5 | 2,000 | <1 | 0.80 | 95 |
| p on n photo-diode | 70 | 6.0E+13 | 40 | 30 | 0.53 | 1,900 | <1 | 0.80 | 95 |

Figure 10

FAST SI DIODES AND ARRAYS WITH HIGH QUANTUM EFFICIENCY BUILT ON DIELECTRICALLY ISOLATED WAFERS

CROSS-REFERENCE TO RELATED APPLICATION

This application claims the benefit of U.S. Provisional Patent Application No. 60/560,881 filed Apr. 9, 2004.

BACKGROUND OF THE INVENTION

1. Field of the Invention

The present invention relates to semiconductor photodiodes, in particular to high frequency, broad spectral range, silicon photodiodes.

2. Prior Art

A growing demand in high-speed photodetectors stimulated creation of a new generation of photodiodes capable of working in NIR (near IR) spectral range with close to 100% quantum efficiency (QE). FIG. 1 represents traditional structures, using single-pass normal incidence absorption regions that are coupled to the transit time, and are not able to decouple the requirements of speed and efficiency from the design parameters of depletion volume and working voltage. Novel approaches may be used to achieve wider bandwidth of over 30 Gb/s with 100% QE using III-V hetero-structures but are not applicable to main stream production. Intensive studies toward creating very fast and highly sensitive photodiodes were performed during the last several years with III-V compound structures based on InP—GaInAsP. The ideas explored include but are not limited to side-illuminated photodiodes, evanescently coupled photodiodes, and those with either an integrated taper or graded-index waveguides.

The idea of creating a waveguide-type Si photodiode is very attractive because it offers a relatively inexpensive, novel design that would be useful in many applications. A few designs based on a waveguide-type Si structures are known in the literature. FIGS. 2A, 2B and 2C present a lateral waveguide detector using a diffraction principle to direct the radiation into a top surface waveguide, while FIG. 3 presents a light trap to capture the radiation in the detector's sensitive region. These designs make use of highly reflective distributed Bragg reflectors (DBR) fabricated using a commercially available double-SOI process, internal total reflection of V-grooves made on the chip back surface, buried reflecting mirror, lateral pin photodiode structure with alternating p-type and n-type doped fingers, and a waveguide-grading-coupler built on the surface of a planar Si photodiode with a buried oxide layer. Each of those photodiodes has drawbacks that limit their application.

The following more detailed discussion of the prior art assumes a p-on-n structure; it is understood that the same device can be made with an n-on-p structure where the names of the anodes and cathodes reversed. Referring now to the drawings, FIG. 1 shows a prior art photodiode with a depletion region 40 designed to separate and capture the generated electron hole pairs. This region is depleted by bias applied to the anode 10 and cathode 20 of the device. The top passivation glass 30 and a metal contact 50 are also shown. As the wavelength increases and the associated absorption length increases, the depletion region 40 must be made deeper requiring more voltage or higher resistivity material to support the depletion. This then presents a diode, which is optimized for the selected wavelength. It is desirable to provide a technique to eliminate this wavelength dependence. The elimination of this dependence points towards a surface region waveguide type of detector.

FIGS. 2A, 2B and 2C show an attempt to accomplish a waveguide design for the p-on-n structure. FIG. 2A, top view, shows the anode 10 and cathode 20 with the active waveguide region 40 located between them. FIGS. 2B and 2C shows side cross-sections, through the anode and cathode respectively, in which the isolation oxide (or buried Bragg mirror) 30 and substrate support 60 are apparent. The issue is to get the light to enter into the top surface of the silicon, and remain there until it is converted into an electrical signal. This detector utilizes a diffraction technique to bend the light wave as it enters the surface of the silicon, so that it moves laterally along the material surface in the sensitive region of the detector. The issue here is that the diffraction grid 55 is both inefficient and wavelength dependent.

FIG. 3 presents another attempt to form a surface detector. It focuses upon the use of repeated reflections at an angle that invokes total internal reflection; hence the light becomes trapped in the surface of the silicon. The issue here is the topside electrode and mirror 70 causes a loss due to surface reflection before the light enters the silicon. This patent teaches that a KOH etch will form grooves in a <100> wafer by selectively etching along a preferential crystalline plane (100) forming an angle of ~54.7°, which is the angle between the [111] and [100] directions. The material 35 is an optical adhesive bonding the silicon 40 to a substrate wafer 60.

The present invention also has its own limitations; however, it out performs the designs mentioned above with respect to a number of important parameters. Most importantly, this design is relatively easy to fabricate in Silicon using dielectrically isolated (DI) wafers similar to those used for photovoltaic cell fabrication.

BRIEF DESCRIPTION OF THE DRAWINGS

The main ideas of the invention as distinguished from the prior art are demonstrated by the accompanying drawings, wherein:

FIG. 9 presents typical performance and design values for a 20 micron structure design.

FIG. 10 presents typical performance and design values for a 30 micron structure design.

DETAILED DESCRIPTION OF THE PREFERRED EMBODIMENTS

Figure 1:
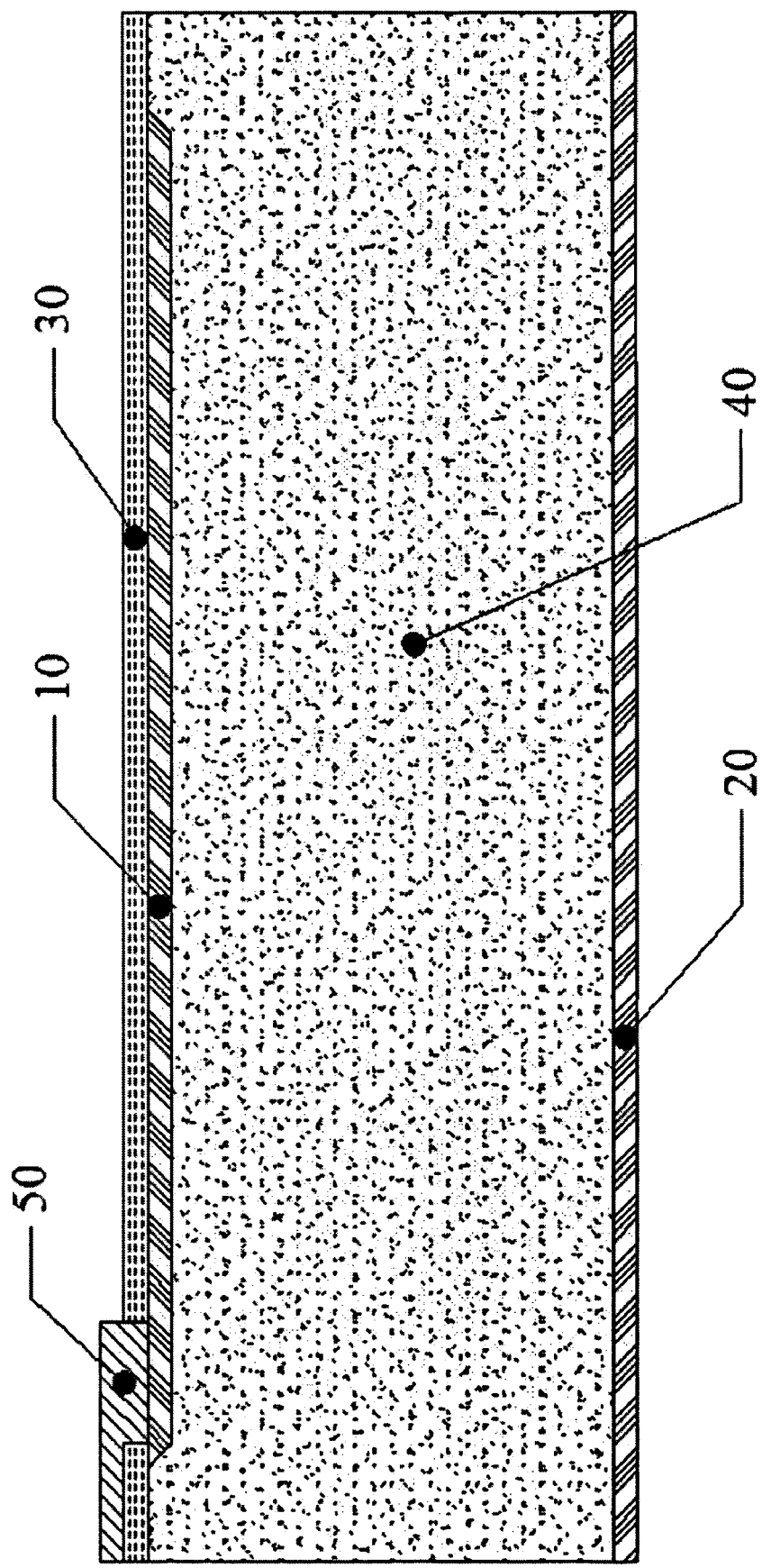
FIG. 1 is a simplified schematic cross section of a typical, conventional structure photodiode using single-pass normal incidence absorption regions that are coupled to the transit time.
Figure 2A:
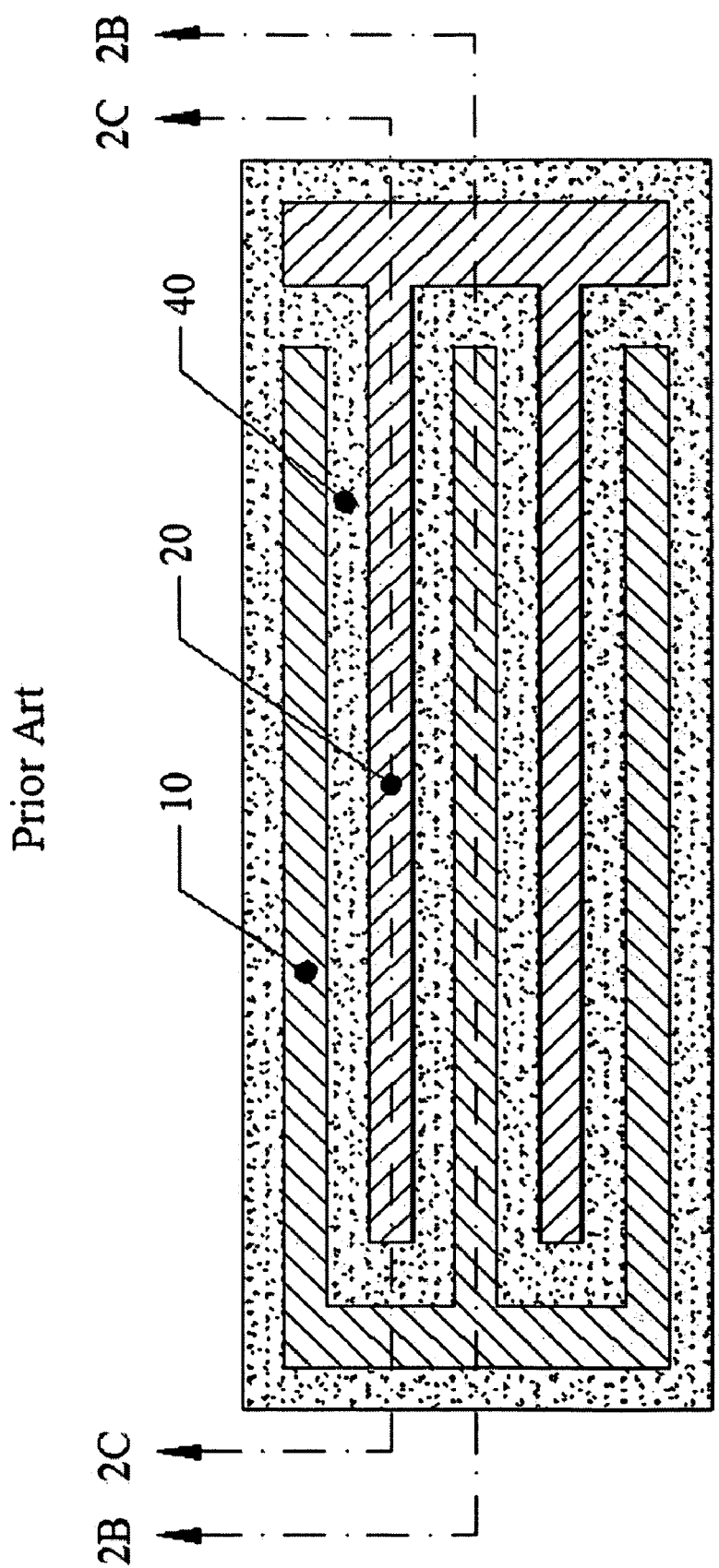
FIG. 2A is a simplified schematic of a waveguide photodetector after Csutak et al. showing a top view without the diffraction coupler.
Figure 2B:
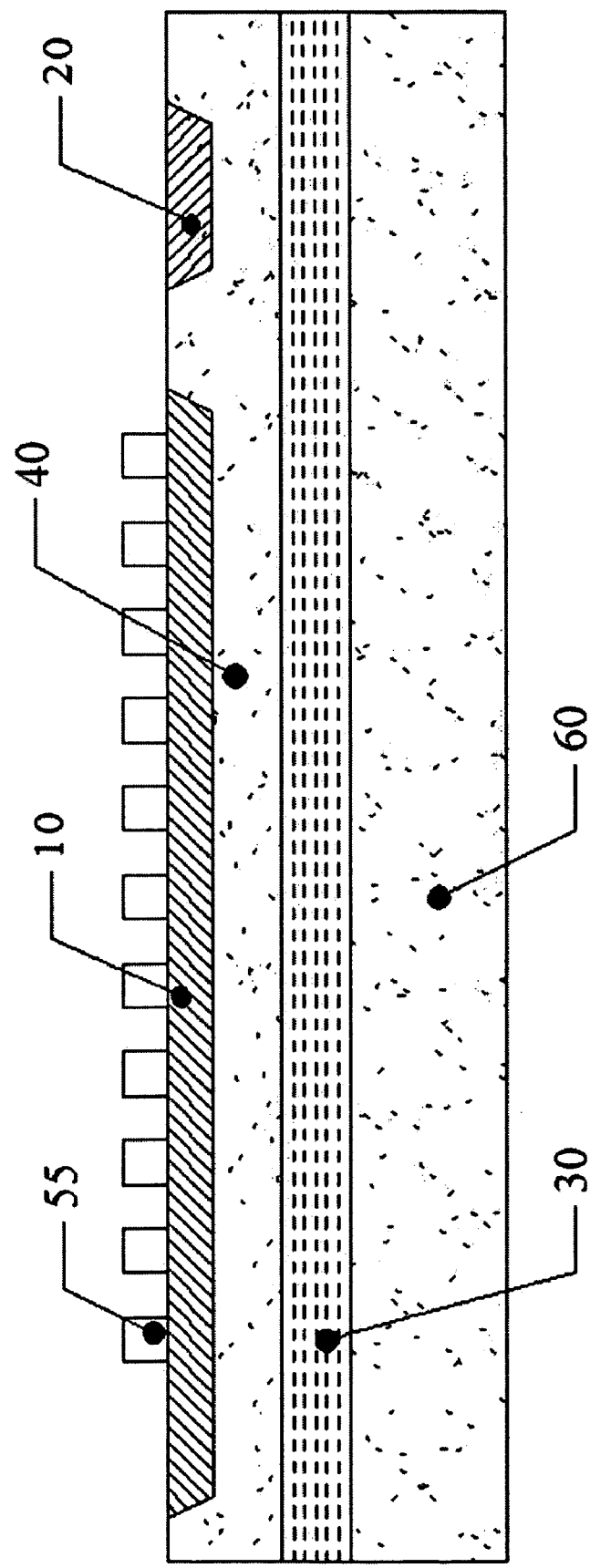
FIG. 2B presents the waveguide photodetector of FIG. 2A in side view cross-section through the anode, with the diffraction coupler.
Figure 2C:
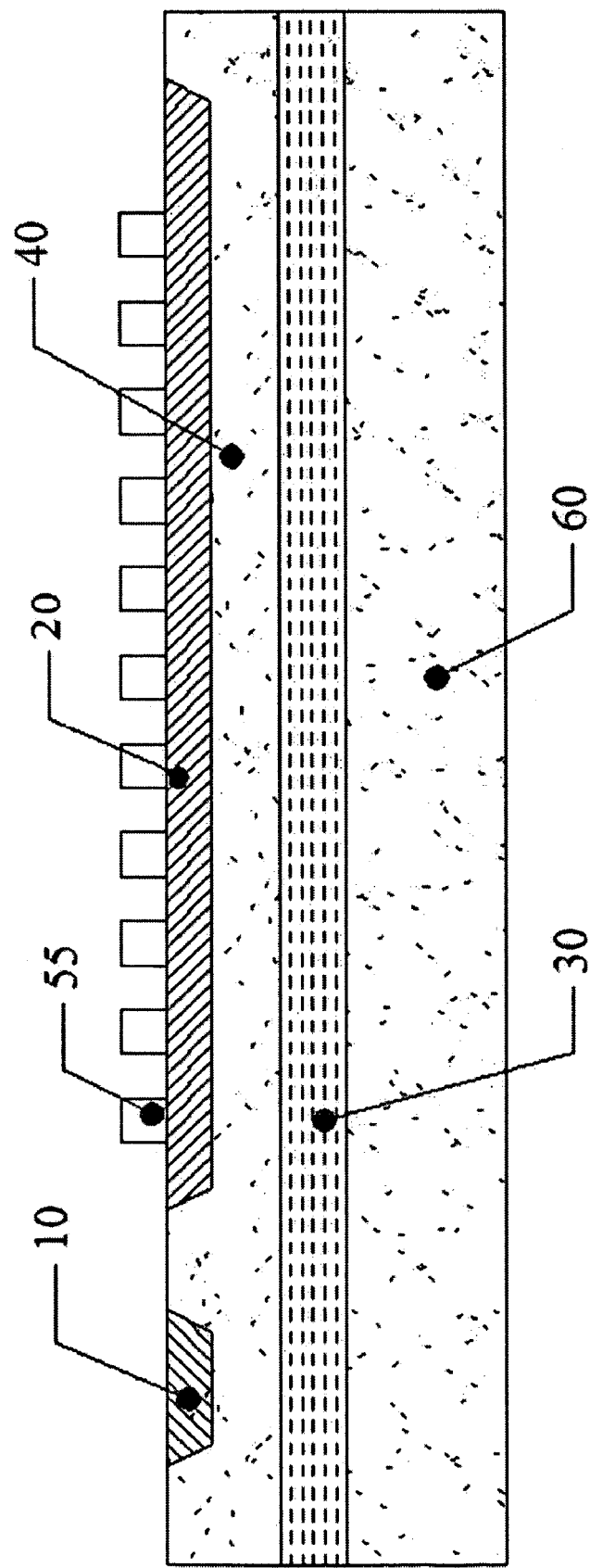
FIG. 2C presents the waveguide photodetector of FIG. 2A in side view cross-section through the cathode, with the diffraction coupler.
Figure 3:
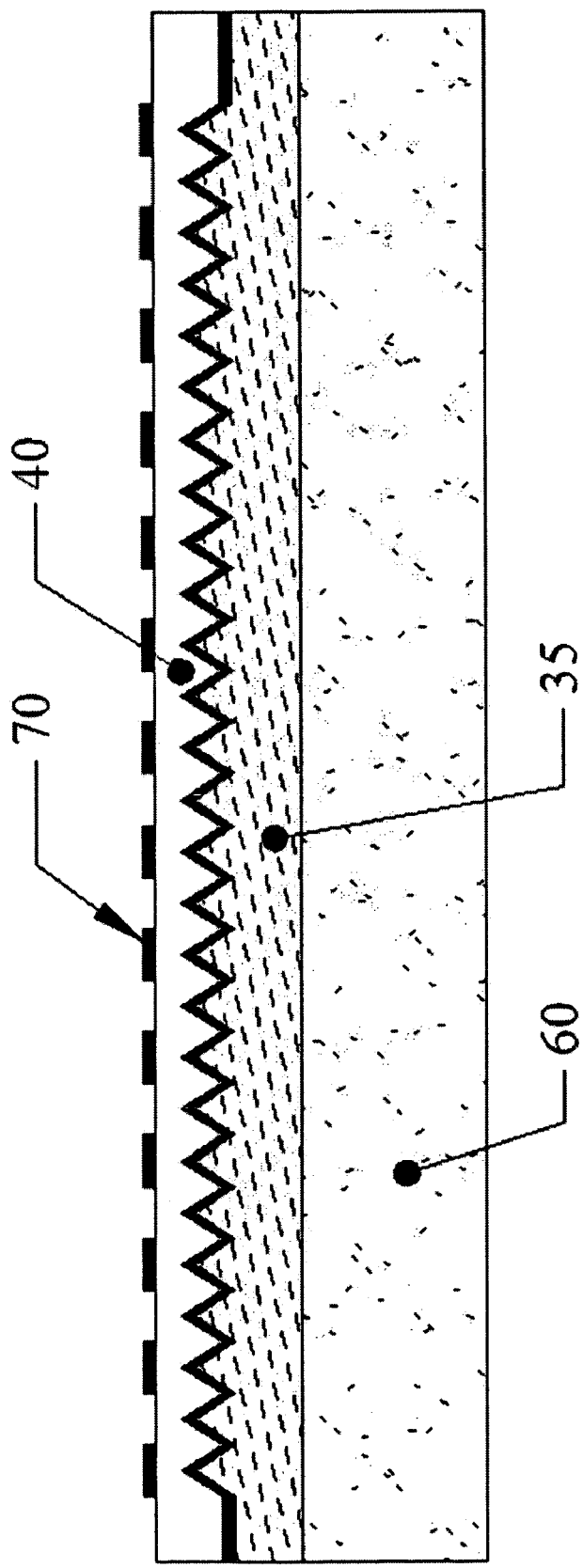
FIG. 3 is a simplified schematic of an infrared detector using a light trapping structure to increase efficiency after Chen et al.
Figure 4:
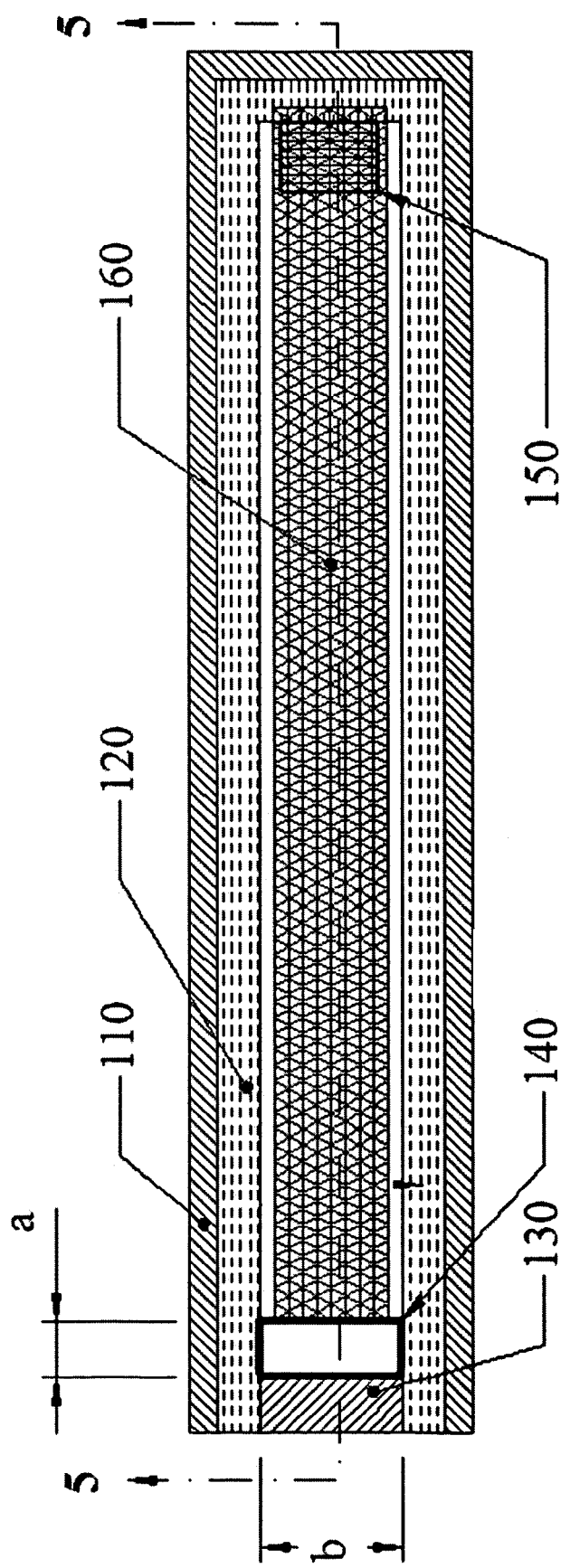
FIG. 4 is a top view of the present invention.

In the present invention, dielectrically isolated (DI) wafer process techniques are used to form a waveguide in the top surface of the silicon that utilizes total internal reflection from the Si—Si Oxide interface to form an internal mirror. This mirror reflects incoming light into the waveguide cavity and traps it there. FIG. 4 is a top view of the preferred embodiment of the invention showing a clear unobstructed entrance aperture 140 at one end of the device. The waveguide runs parallel to this top surface and includes the anode diffusion 160 of the p-on-n structure; this would be the cathode for the case of n-on-p structure. The silicon oxide 120 delineates the extent of the waveguide, sides, bottom, ends and top, and is surrounded by a supporting material 110 such as poly-silicon. This material, if conductive, can be used to form an electrical path from the contact 130 to the backside of the wafer, or if a dielectric material is used the contact can be formed on the front side by adding bond pads. It should be noted that it is possible to attach a substrate wafer for strength and handling purposes in which case the layer 110 would be an adhesive over the substrate wafer. Depositing poly silicon and polishing it could also facilitate the use of a direct bonded substrate for handling purposes. Whatever is used, whether a deposited layer or an adhesive layer bonded to a substrate shall be referred to in the claims as a body to distinguish from the silicon regions forming the photodiodes.

Figure 5:
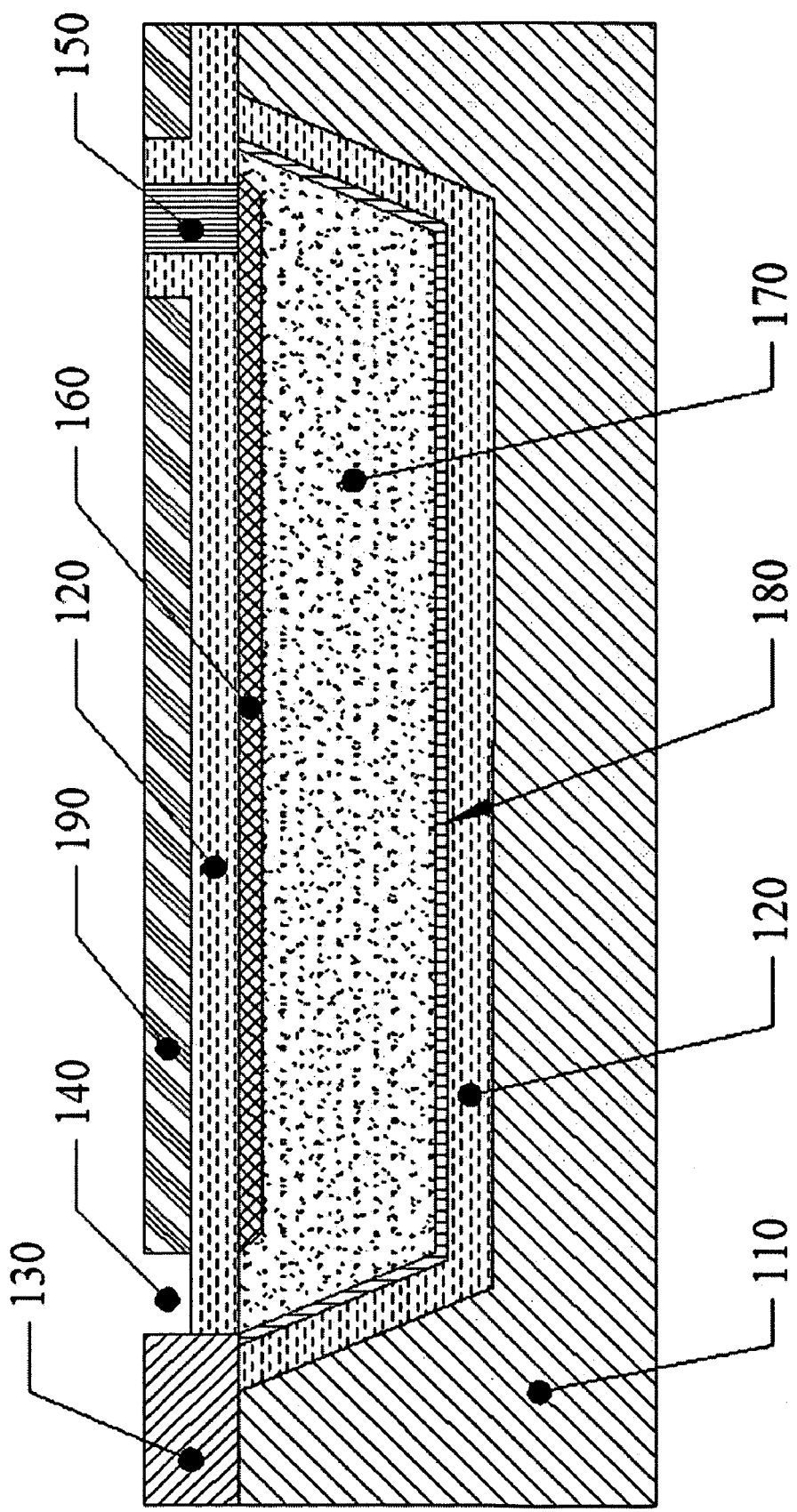
FIG. 5 is a side view in cross section of the present invention taken along line 5-5 of FIG. 4.

The lateral dimension "b" is not coupled to any of the waveguide performance characteristics, and can be selected as needed for the incoming light. The dimension "a" is coupled to the depth "h" of the waveguide as can be seen in FIG. 5. Increasing "a" requires a deeper waveguide to assure that the beveled mirror surface is beneath the aperture. FIG. 5 also shows the optional masking layer 190 that is normally added to eliminate any stray light thereby reducing this source of noise.

Figure 6:
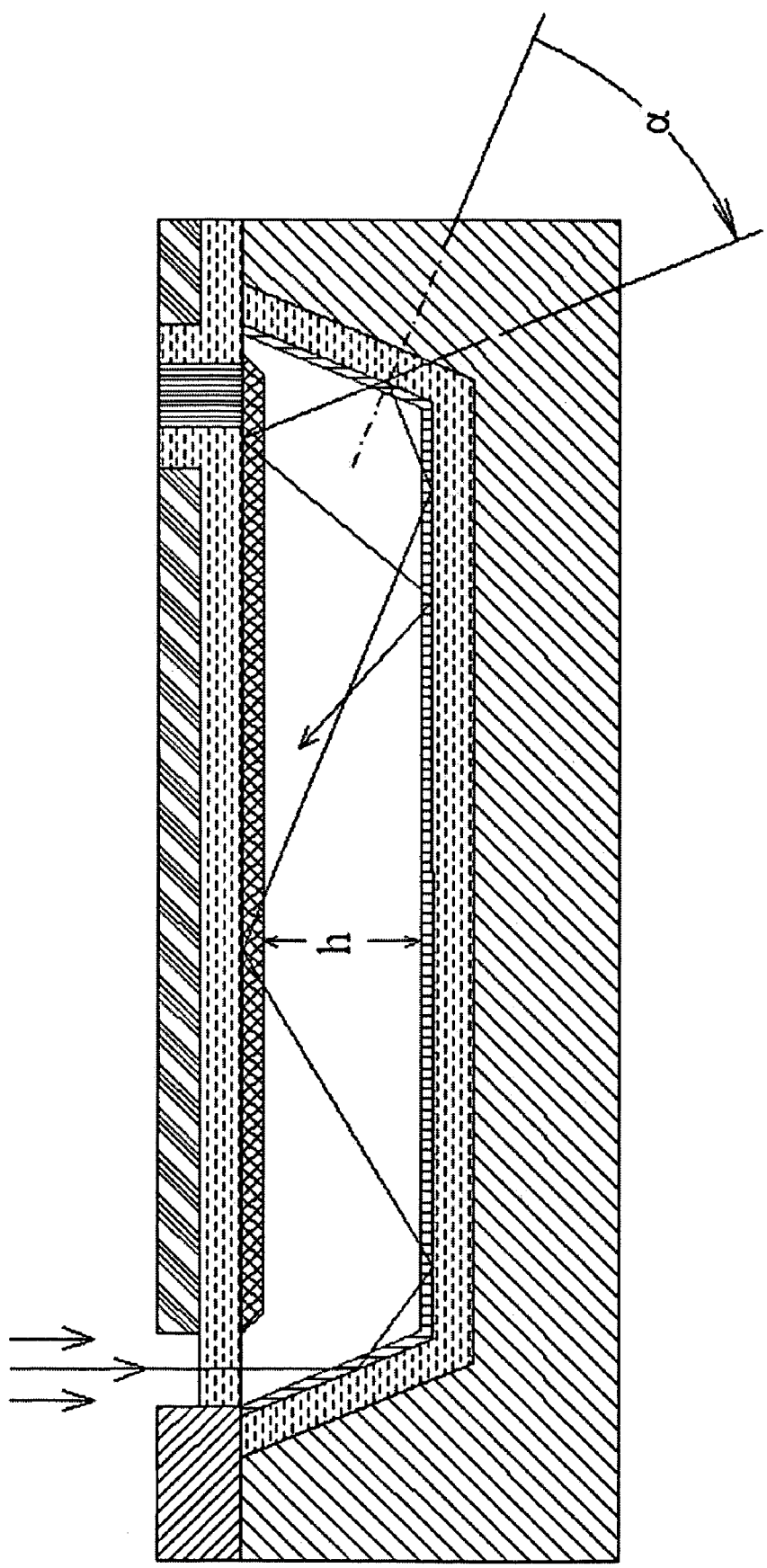
FIG. 6 shows a ray trace of the light within the waveguide.

The waveguide includes the active silicon volume 170, which is normally fully depleted when biased in use, the anode (cathode) 160 and the cathode (anode) 180. In the preferred embodiment, it is fully encased in silicon oxide except for the contacts 130 and 150. FIG. 6 shows a ray trace within the waveguide, demonstrating trapping of the light within the active volume. Note that the waveguide construction is, to first order, independent of the wavelength thereby providing a broad spectral range of usefulness. Second order effects associated with the wavelength vary the onset angle for total internal reflection; this variation is small and is normally not a design issue.

Thus in the preferred embodiment, the effect of a total internal reflection of light from Si—Si oxide interface is exploited. Note that for this interface, the total internal reflection angle is equal to approximately 24 degrees for the NIR spectral range. Therefore, the total internal reflection condition is fulfilled for the V-groove type structure built in this work.

Light penetrates the opening aperture of the photodiode and reflects totally from the V-groove wall due to the total internal reflection effect (see FIG. 6). Several multiple total internal reflections follow which facilitate loss-free light propagation inside the waveguide, allowing absorption of the entire optical radiation signal. The lateral light propagation is de-coupled from the transverse motion of non-equilibrium carriers, thereby eliminating the requirement of a deeper depletion for a longer wavelength. Under conditions of total depletion of the waveguide depth "h", the transit time of non-equilibrium carriers is governed by the electric field only. By properly selecting the starting material resistivity and the reverse bias value, the carriers' transit velocity can be saturated and their drift time minimized.

The structure should be designed in a way such that the "rear" surface angle of incidence α is larger than the total internal reflection angle of approximately 24 degrees—(see FIG. 6). Such a design will optimize the sensitivity of this photodiode in near infrared spectral range. It is obvious that to satisfy the above condition, the overall length of the waveguide may be within certain allowed ranges, specific for each depth of the waveguide and opening aperture size.

The main characteristics of an exemplary design are summarized in FIGS. 9 and 10 for wave-guide depths of "h"=20 um and 30 um, respectively. Note that the length of the waveguide is not specified in these Figures.

FIGS. 9 and 10 compare characteristics of some potentially useful p-on-n and n-on-p structures. Note that due to a trade-off between the electric field value at a certain reverse bias and Si resistivity from the one side, and the carrier velocity from the other side, a very short value of the time response and, correspondingly, a high frequency bandwidth could be obtained for both the p-type and n-type material. The cut-off frequency will be higher than the frequency bandwidth shown in FIGS. 9 and 10.

Note also that the values of responsivity and quantum efficiency (QE) given in FIGS. 9 and 10 were calculated assuming no loss of non-equilibrium carriers due to any type of carrier recombination processes in the bulk and using the value R=85% for the reflection coefficient from the Si-metal surface.

Among the limitations of the disclosed structure is a small opening (photo sensitive) area. However, many of the fast photodiodes available on the market, especially those for the telecommunication applications, also have by design a small sensitive area of ca. 50 um×50 um or even smaller. Use of lenses, especially micro-lenses, allows focusing the optical beam into a small spot, thus improving the sensitivity of the devices.

The design allows building a photodiode with a rectangular-shaped opening area (a×b), with practically no restriction to the size b of a longer side. Using a cylindrical lens, one can sharp focus the optical beam into a narrow strip, relaxing the alignment requirements along one of the two coordinates.

Figure 7:
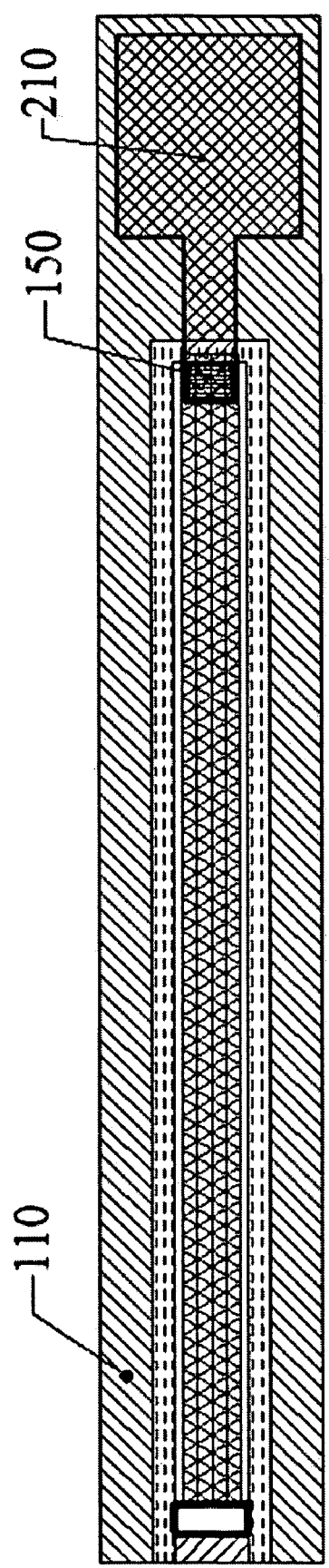
FIG. 7 presents a single element of an array with the bond pad attached.
Figure 8:
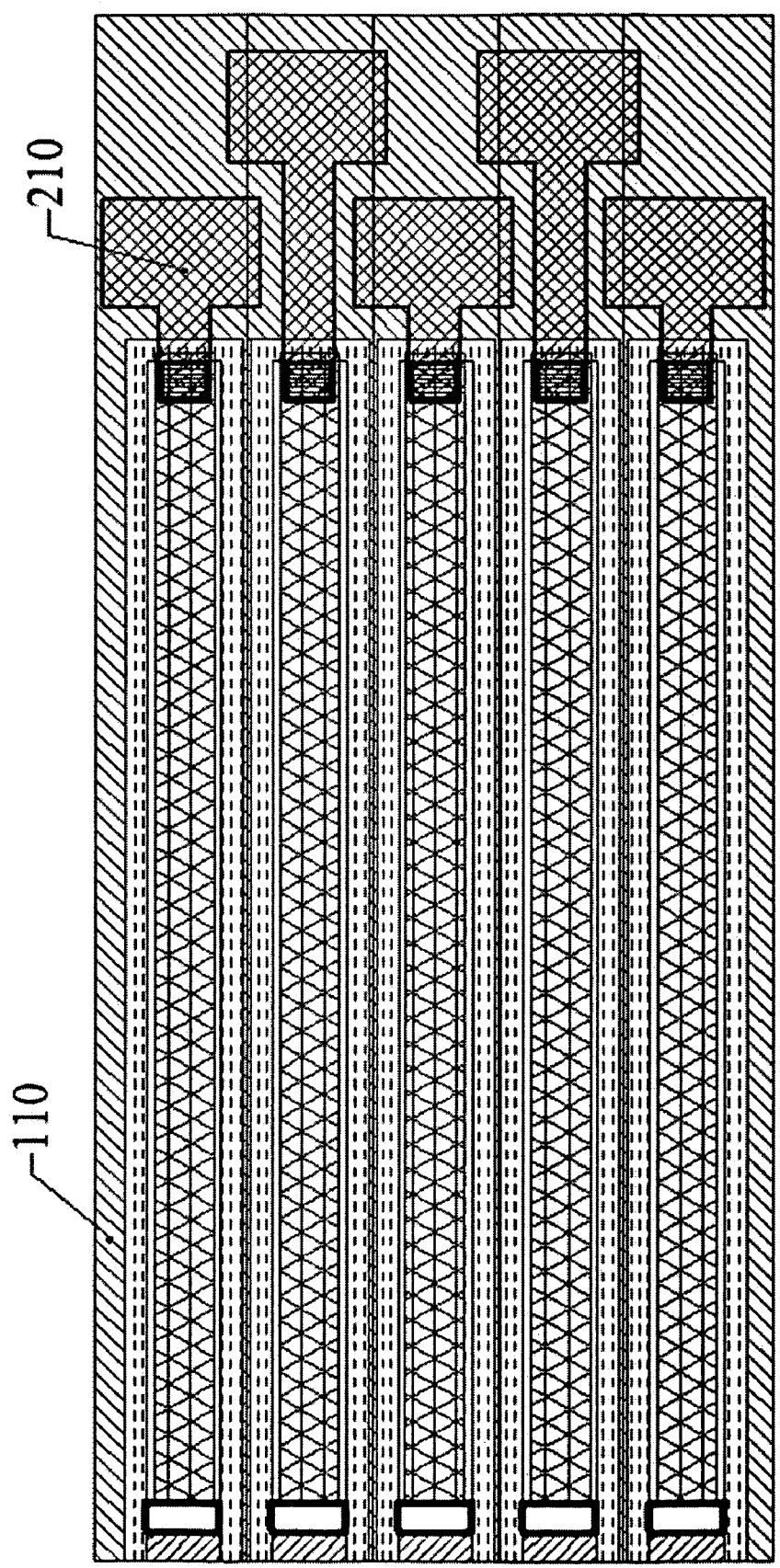
FIG. 8 is an array made of elements shown in FIG. 7.

The design allows building 1D arrays with very small gaps between the elements. FIG. 7 illustrates a single element, which can be reproduced to form an array. This Figure shows the added bond pad 210 attached to the anode (cathode) contact 150 and utilizes a backside wafer contact for the cathode (anode) connection. FIG. 8 shows a grouping of 5 elements to form a small linear array. These have a common backside contact for the cathode (anode).

In the embodiment shown in FIGS. 5 and 6, the cathode (anode) 180 covers bottom and sides of the active volume 170. This layer, which is more heavily doped than the active volume, need not cover the sides, but as a minimum, should cover most if not all the bottom of the active volume 170. However, since it is necessary to make electrical contact from the cathode (anode) 180 to metalization 130 if both anode and cathode contacts are to be accessible from the same side of the photodiode, a convenient way to do this is to at least have the cathode (anode) 180 also cover at least part of one side of the active volume 170 for continuity purposes. Also, mask layer 190 is shown not contacting metal contact 150. However, even the mask layer is a metal layer, formed by patterning a metal layer to simultaneously form the electrical contacts and the mask layer, the metal mask layer may electrically contact the metal contact 150, as the metal contact 150 will be at the same voltage as the anode (cathode) 160 under the mask layer and therefore not significantly increase the resulting capacitance of the anode (cathode) 160.

A process to produce these devices or arrays would start with a <100> substrate of about 400 Ohm-cm. An N-type (P-type) substrate would be used for a top Anode (Cathode). Different resistivity values could be used as long as the active volume 170 in FIG. 5 is essentially fully depleted when biased. An oxide is deposited or grown on the surface, and patterned to expose those areas, which will be removed to form the angled mirror surfaces. An isotropic etch such as KOH is used to form these mirrors, after which the oxide layer is removed.

At this point the N-type cathode (P-type anode) 180 is applied by an ion implant technique. It is also possible to use a standard furnace deposition for this step. An oxide layer 120 is then formed either by deposition or thermal growth, and the substrate material 110 is applied. The preferred embodiment uses polysilicon for this layer with a thickness of 30 um to 100 um although thicker layers may be used. The wafer is then inverted and the previous "bottom" is polished off exposing the new top surface of the device oriented as shown in FIG. 5.

Using a mask, the P-type anode (N-type cathode) 160 is applied by ion implantation, and top oxide layer 120 is grown or deposited. If grown, the furnace cycle will act to activate the implanted impurities. If deposited, a rapid thermal processing step will be used for activation. It is understood that normal furnace operations could be substituted for the ion implantation and activation steps. The contact openings are formed by normal photolithography and etch techniques, and metal is deposited and patterned to form the contacts and bond pads 130 and 150. This same metal layer can be used to form the optional light-masking layer 190 if desired.

While certain preferred embodiments of the present invention have been disclosed and described herein for purposes of illustration and not for purposes of limitation, it will be understood by those skilled in the art that various changes in form and detail may be made therein without departing from the spirit and scope of the invention.

What is claimed is:

1. A photodiode comprising:
   an active volume of silicon of a first conductivity type having a top surface, a bottom surface and side surfaces;
   a first silicon layer on the bottom surface of the active volume of silicon, the first silicon layer being of the first conductivity type and more highly doped than the active volume;
   a first silicon oxide layer over the first silicon layer and the bottom and sides of the active volume of silicon;
   a second silicon layer of a second conductivity type on most of the top surface of the active volume of silicon and not touching the first silicon layer;
   a first metal region in electrical contact with the first silicon layer; and,
   a second metal region in electrical contact with the second silicon layer;
   at least a first side surface of the active volume being inclined to provide substantially total reflection of light from the silicon-silicon oxide interfaces for light entering the active volume perpendicular through the first surface of the active volume over the inclined surface.

2. The photodiode of claim 1 wherein the first silicon layer extends up at least one side surface of the active volume for electrical contact with the first metal region.

3. The photodiode of claim 2 wherein the first silicon layer extends up all side surfaces of the active volume.

4. The photodiode of claim 1 wherein all side surfaces of the active volume are inclined, the light reflected from the first surface being substantially totally confined within the active volume by further reflections from silicon-silicon oxide interfaces and silicon-metal interfaces.

5. The photodiode of claim 4 further comprising an oxide layer separating the first and second metal regions.

6. The photodiode of claim 1 further comprising an opaque masking layer defining a window over the first inclined side surface for entry of light into the active volume.

7. A plurality of photodiodes, each in accordance with claim 6, the photodiodes being disposed and supported in a body to form a linear photodiode array.

8. The plurality of photodiodes of claim 7 wherein the opaque masking layer is a metal layer.

9. The plurality of photodiodes of claim 8 wherein the opaque masking layer, the first metal regions and the second metal regions are formed by patterning a single metal layer.

10. The photodiode of claim 1 wherein the photodiode is supported in a body.

11. A plurality of photodiodes, each in accordance with claim 1, the photodiodes being disposed and supported in the body to form a linear photodiode array.

12. The plurality of photodiodes of claim 1 further comprising an opaque masking layer defining a window over the first inclined side surface for entry of light into the active volume.

13. The plurality of photodiodes of claim 1 wherein the opaque masking layer is a metal layer.

14. The plurality of photodiodes of claim 13 wherein the opaque masking layer, the first metal region and the second metal region are formed by patterning a single metal layer.

15. A photodiode comprising:
   an active volume of silicon of a first conductivity type having a top surface, a bottom surface and side surfaces;
   a first silicon layer on the bottom surface and side surfaces of the active volume of silicon, the first silicon layer being of the first conductivity type and more highly doped than the active volume;
   a first silicon oxide layer over the first silicon layer;
   a second silicon layer of a second conductivity type on most of the top surface of the active volume of silicon and not touching the first silicon layer;
   a first metal region in electrical contact with the first silicon layer; and,
   a second metal region in electrical contact with the second silicon layer;
   the side surfaces of the active volume being inclined to provide substantially total reflection of light from the silicon-silicon oxide interfaces for light entering the active volume perpendicular through the first surface of the active volume over the inclined surface.

16. The photodiode of claim 15 further comprising an oxide layer separating the first and second metal regions.

17. The photodiode of claim 16 further comprising an opaque masking layer defining a window over the first inclined side surface for entry of light into the active volume.

18. A plurality of photodiodes, each in accordance with claim 17, the photodiodes being disposed and supported in a body to form a linear photodiode array.

19. The plurality of photodiodes of claim 18 wherein the opaque masking layer is a metal layer.

20. The plurality of photodiodes of claim 19 wherein the opaque masking layer, the first metal regions and the second metal regions are formed by patterning a single metal layer.

21. The photodiode of claim 15 wherein the photodiode is supported in a body.

22. A plurality of photodiodes, each in accordance with claim 15, the photodiodes being disposed and supported in the body to form a linear photodiode array.

23. The plurality of photodiodes of claim 22 further comprising an opaque masking layer defining a window over the first inclined side surface for entry of light into the active volume.

24. The plurality of photodiodes of claim 23 wherein the opaque masking layer is a metal layer.

25. The plurality of photodiodes of claim 24 wherein the opaque masking layer, the first metal regions and the second metal regions are formed by patterning a single metal layer.

* * * * *